United States Patent [19]
Hsu

[11] Patent Number: 6,018,183
[45] Date of Patent: *Jan. 25, 2000

[54] STRUCTURE OF MANUFACTURING AN ELECTROSTATIC DISCHARGE PROTECTIVE CIRCUIT FOR SRAM

[75] Inventor: Chen-Chung Hsu, Taichung, Taiwan

[73] Assignee: United Microelectronics Corp., Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/164,926

[22] Filed: Oct. 1, 1998

[30] Foreign Application Priority Data

Jun. 20, 1998 [TW] Taiwan ................... 87109960

[51] Int. Cl.[7] .................................................. H01L 23/62
[52] U.S. Cl. ......................... 257/355; 257/356; 257/362; 257/359
[58] Field of Search .................................... 257/355–363, 257/546, 547, 371, 173

[56] References Cited

U.S. PATENT DOCUMENTS

| | | | |
|---|---|---|---|
| 4,786,956 | 11/1988 | Puar | 257/361 |
| 4,829,344 | 5/1989 | Bertotti et al. | 257/546 |
| 5,016,080 | 5/1991 | Giannella | 257/204 |
| 5,365,103 | 11/1994 | Brown et al. | 257/362 |
| 5,436,183 | 7/1995 | Davis et al. | 257/360 |
| 5,451,801 | 9/1995 | Anderson et al. | 257/202 |
| 5,557,130 | 9/1996 | Orchard-Webb | 257/358 |
| 5,646,062 | 7/1997 | Yuan et al. | 438/281 |
| 5,717,251 | 2/1998 | Hayashi et al. | 257/759 |

FOREIGN PATENT DOCUMENTS 360246668  12/1985  Japan ..................................... 257/358

*Primary Examiner*—Tom Thomas
*Assistant Examiner*—Ori Nadav
*Attorney, Agent, or Firm*—Jiawei Huang; J. C. Patents

[57] ABSTRACT

A structure of manufacturing an electrostatic discharge protective circuit for SRAM. In the structure, a MOS transistor is coupled between an input port and an internal circuit, and an input bonding pad is coupled to the input port and the internal circuit. Furthermore, the source of the MOS transistor is connected to the gate of the MOS transistor by a polysilicon layer which is coupled to a potential line. A via connects the drain of the MOS transistor to a metal layer. Then, the metal layer is coupled to the input bonding pad.

14 Claims, 6 Drawing Sheets

1

STRUCTURE OF MANUFACTURING AN ELECTROSTATIC DISCHARGE PROTECTIVE CIRCUIT FOR SRAM

CROSS-REFERENCE TO RELATED APPLICATION

This application claims the priority benefit of Taiwan application serial no. 87109960, filed Jun. 20, 1998, the full disclosure of which is incorporated herein by reference.

BACKGROUND OF THE INVENTION

1. Field of the Invention

The invention relates to a structure of an electrostatic discharge (ESD) protective circuit for SRAM, and in particular to a structure of an electrostatic discharge protective circuit, which is formed on the bottom of a bonding pad and provides a large drain node for SRAM.

2. Description of the Related Art

In the IC process, an electrostatic discharge is a main factor to cause IC damage. In other words, the problem of the electrostatic discharge always leads to sub-micron IC breakdown. In order to overcome the above-mentioned problem, on-chip electrostatic discharge protective circuits are used to dispose on input/output bonding pads of a CMOS IC. However, the protective function of the electrostatic discharge protective circuits is seriously declined in line with the development of the IC process. Consequently, how to efficiently enhance the function of electrostatic discharge protective circuits is urgently expected by semiconductor industry.

SRAM is a memory with a highest operation speed in all current memories, and widely applied, for example, in computer data accesses, microcomputers and microprocessors. Therefore, the structure of electrostatic discharge protective circuits used in SRAM urgently needs to be improved.

Referring to FIG. 1A, electrostatic charges inputted to an input port INP are discharged to ground $V_{ss}$ via an N-type MOS transistor N1, thereby protecting an internal circuit 10. Referring to FIG. 1B, electrostatic charges inputted to an input port INP are discharged to ground $V_{ss}$ via an N-type MOS transistor N1 or to a voltage source $V_{DD}$ via a P-type MOS transistor, thereby protecting an internal circuit 10.

Referring to FIG. 2, a MOS transistor N1 includes a substrate 20, a drain 22 coupled to an internal line I/P by a first via 24, a source 26 coupled to ground $V_{ss}$ by a second via 28. In addition, a gate 29 is positioned between the source 26 and the drain 22.

Furthermore, referring to FIG. 3, a metal bonding pad 30 is formed on the input line I/P. FIG. 2 is a cross-sectional view along line I–I' of FIG. 3. In FIG. 3, reference numbers 24 and 28 designate a first via 24 and a second via 28; and reference number 29 designates a gate. The source 26 and the gate 29 all are coupled to ground Vss. The drain 22 is coupled to the input line I/P. The input line I/P is coupled to the metal bonding pad 30.

To the structure of an electrostatic discharge protective circuit, the capability of electrostatic discharge depends on the sizes of drain nodes, the number of nodes, the pitches between nodes and gates and the thickness of conductors which determine whether or not heat dissipation is completed in a short time. As can be known from FIG. 3, metal connections for drain and source regions are finger-shaped. Due to small areas of the metal connections, power consumption is unstable. Furthermore, since the metal connec-

2 tions are finger-shaped, the structure of an electrostatic discharge protective circuit is unable to be formed on the bottom of a bonding pad to efficiently reduce the use area of SRAM; source is unable to directly connect to gate; and the layout of the structure of an electrostatic discharge protective circuit for SRAM needs additional metal connections. Furthermore, due to the small areas of drains, a large number of nodes, short pitches between nodes and gates and thin conductors, the heat dissipation of the structure is poor.

SUMMARY OF THE INVENTION

In view of the above, the object of the invention is to provide a structure of an electrostatic discharge protective circuit which is formed on SRAM having buried contacts. In the structure, a large metal layer is disposed on a drain region, thereby enhancing the capability of heat dissipation; source and gate together are connected to ground, thereby obtaining a minimum of drain area, and meanwhile the widthes of conductors are maintained at proper values; a bonding pad is formed on the top of the structure of an electrostatic discharge protective circuit, thereby reducing the area of the device, without affecting the capability of electrostatic discharge, such that the function of the electrostatic discharge structure is improved.

In a structure of an electrostatic discharge protective circuit for SRAM according to the invention, a MOS transistor is coupled between an input port and an internal circuit. the source of the MOS transistor is connected to gate by a polysilicon layer which is coupled to a potential line. Then, a via connects drain to a metal layer. The metal layer is coupled to an input bonding pad. Since the metal layer is disposed above the drain, the heat dissipation capability of the structure is enhanced, and the width of a common conductor for connecting the source and gate is maintained at a proper value.

In another structure of an electrostatic discharge protective circuit for SRAM according to the invention, a MOS transistor is coupled between an input port and an internal circuit, and an input bonding pad is coupled to the input port and the internal circuit. The source of the MOS transistor is connected to gate via a polysilicon layer which is coupled to a potential line, by buried contact process. Thereafter, a via connects the source to a metal layer. The metal layer is coupled to an input bonding pad. Moreover, the input bonding pad is disposed above the MOS transistor, such that the area of the device can be further reduced without affecting the capability of electrostatic discharge.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE EMBODIMENT

In general, contact window structures in traditional SRAM are mostly formed on source/drain regions. However, for some high-integration ICs, the way of forming the contact windows is not fairly appropriate. Therefore, buried contact windows suitable for local internal connections are introduced. The buried contact windows can reduce the use area of chips. For example, about 25% of use area is reduced. Hence, the buried contact window process for high-density products shows an extremely high effectiveness.

With regard to a method of forming a typical buried contact window, first, a doped polysilicon layer is formed on a predetermined buried contact window region, and then a heat treatment is performed. Therefore, the dopant of the doped polysilicon layer diffuses into a silicon substrate. The doped polysilicon layer can remain on the buried contact window region for connecting the buried contact window and a conductor. Next, the buried contact window is used to serve as the structure of an electrostatic discharge protective circuit for SRAM.

Figure 1A:
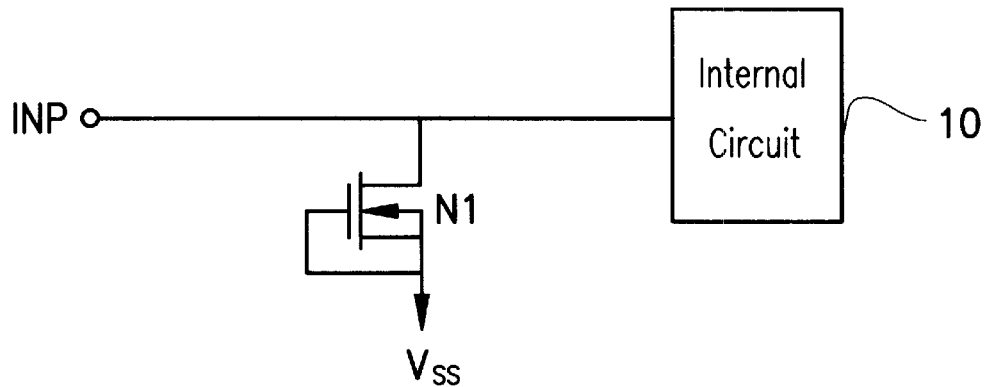
FIG. 1A is a circuit diagram showing an electrostatic discharge protective circuit for SRAM.
Figure 1B:
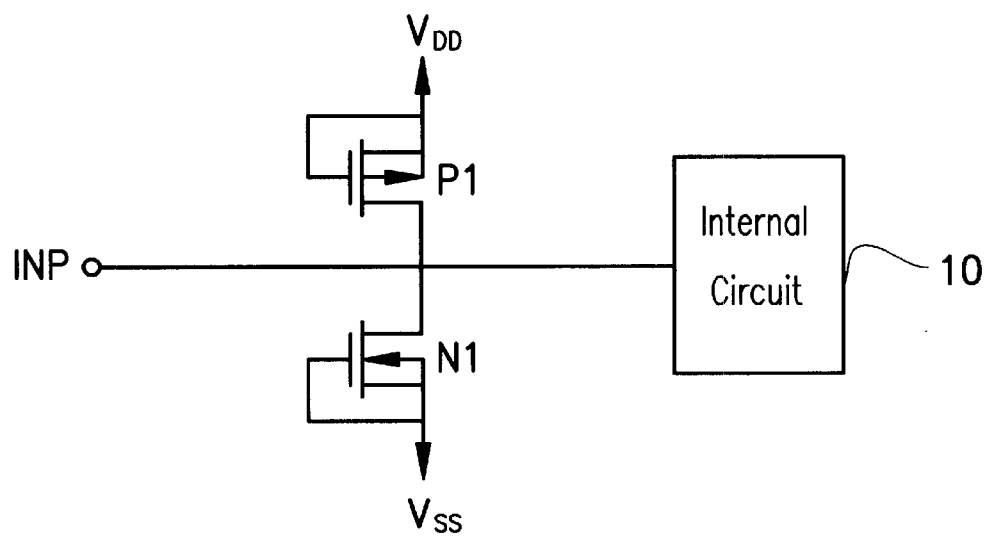
FIG. 1B is a circuit diagram showing another electrostatic discharge protective circuit for SRAM.
Figure 2:
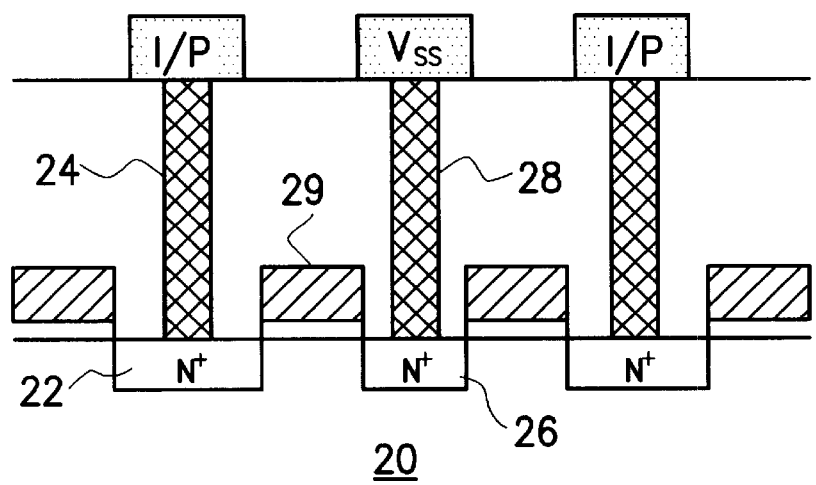
FIG. 2 is a cross-sectional view showing the structure of an electrostatic discharge protective circuit for SRAM of FIG. 1A.
Figure 3:
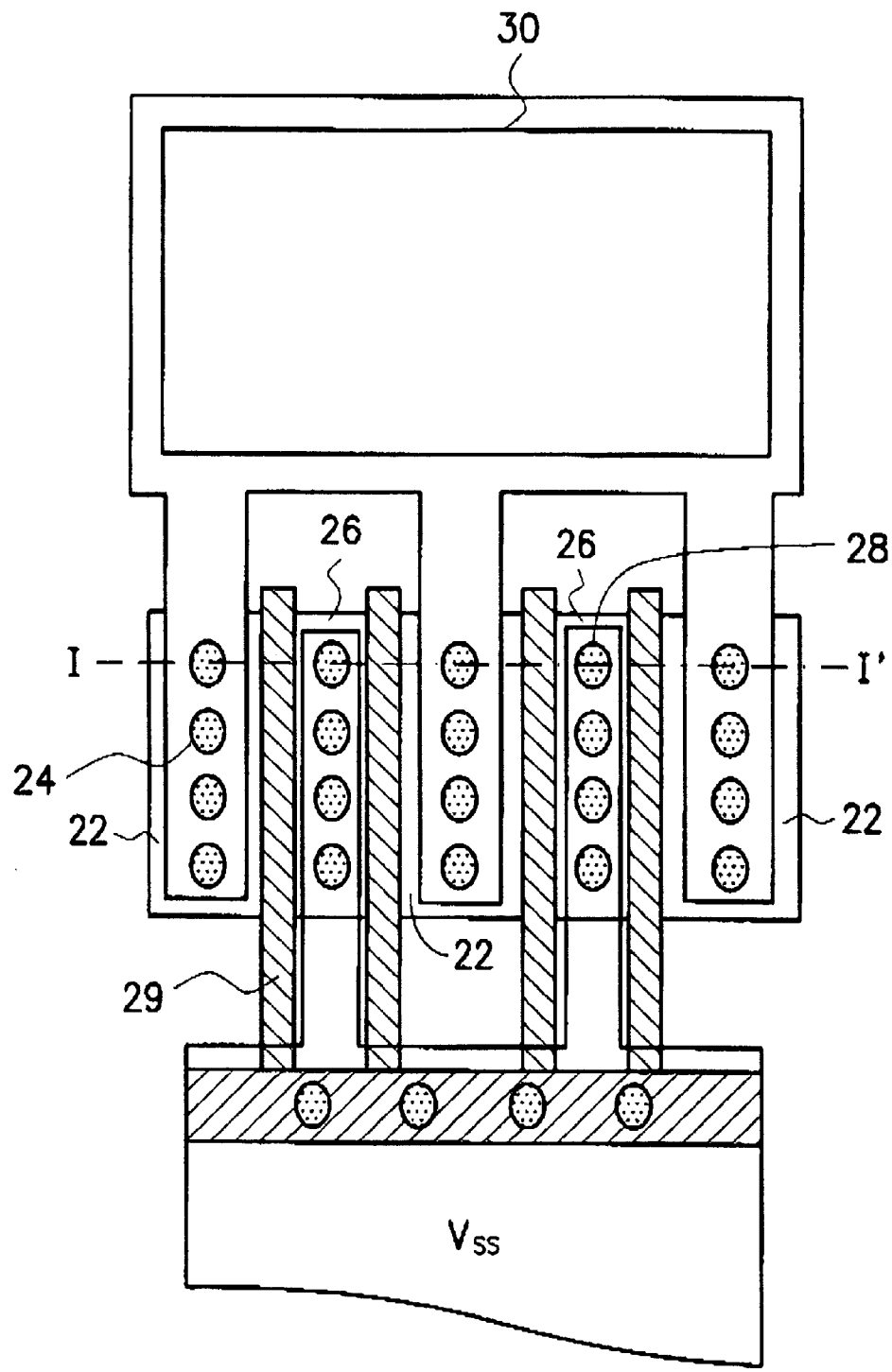
FIG. 3 is a top view of FIG. 2.
Figure 4A:
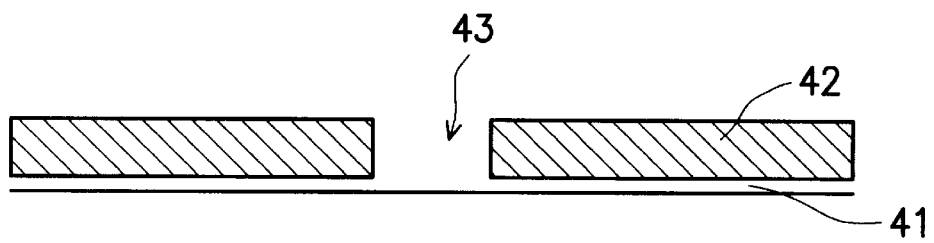
FIGS. 4A–4F are cross-sectional views showing the structure of manufacturing an electrostatic discharge protective circuit according to a preferred embodiment of the invention.

Referring to FIGS. 4A–4F, an example of manufacturing a structure of an N-type MOS electrostatic discharge protective circuit is shown. However, a structure of a P-type MOS electrostatic discharge protective circuit can also be manufactured by using the same method. First, as shown in FIG. 4A, gate oxide layers 41 are formed on a substrate 40. A first polysilicon layer 42 is deposited on the gate oxide layer 41, and then a source doping region 43 is formed by photolithography and etching.

Figure 4B:
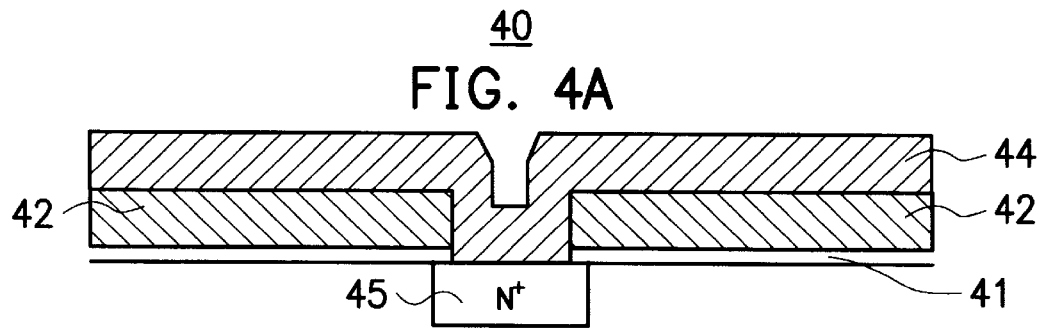

Next, as shown in FIG. 4B, a second polysilicon layer 44 is deposited on the first polysilicon layer 42 and the source doping region 43, and then a source 45 is formed by ion implanting the second polysilicon layer 44 with N-type ions.

Figure 4C:
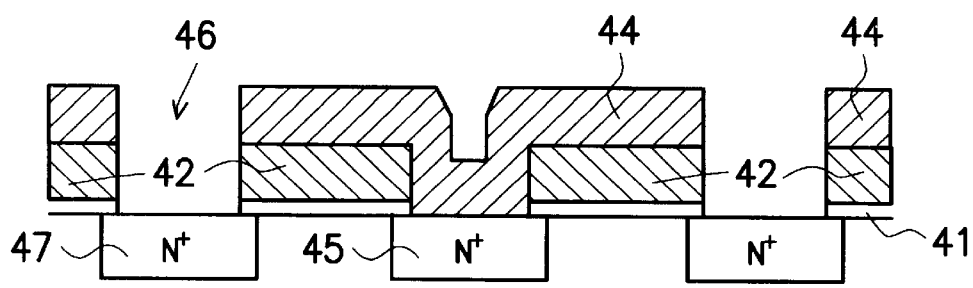

Subsequently, as shown in FIG. 4C, the first polysilicon layer 42 and the second polysilicon layer 44 are partly etched to form drain doping regions 46, and then drains 47 are formed by ion implanting the drain doping region 46 with N-type ions.

Figure 4D:
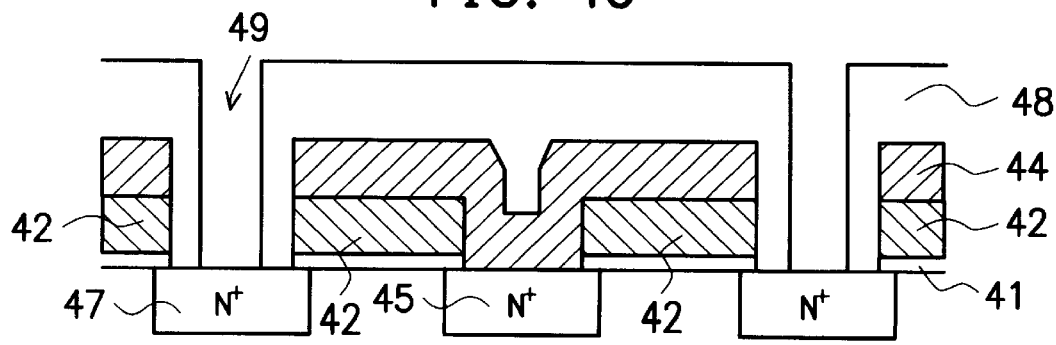

Thereafter, as shown in FIG. 4D, a dielectric layer 48, such as a Tetra-Ethyl-Orthosilicate (TEOS) layer or a BPSG layer, is deposited on the second polysilicon layer 44 and drains 47, and then via holes 49 are formed on the dielectric layer 48 by photolithography and etching to expose the surface of drains 47.

Figure 4E:
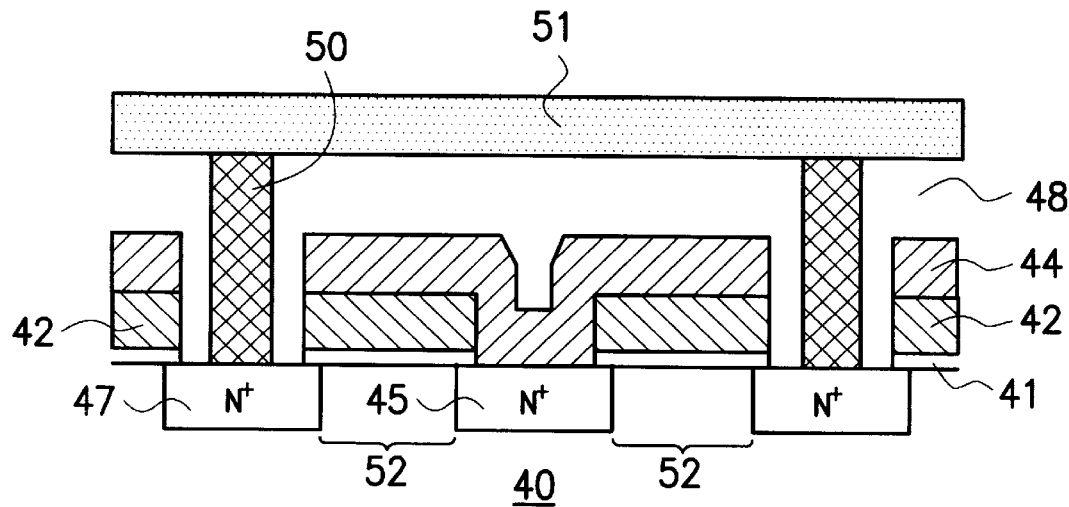

After that, as shown in FIG. 4E, vias 50, such as a layer including a titanium sub-layer, a titanium nitride sub-layer and a tungsten sub-layer in order, are formed in the via holes 49 by a method used for general via formation. Then, a metal layer 51 is formed on the dielectric layer 48 and the vias 50 to electrically connect the drains 47. In FIG. 4E, gates 52 are positioned between the source 45 and the drains 47.

Figure 5A:
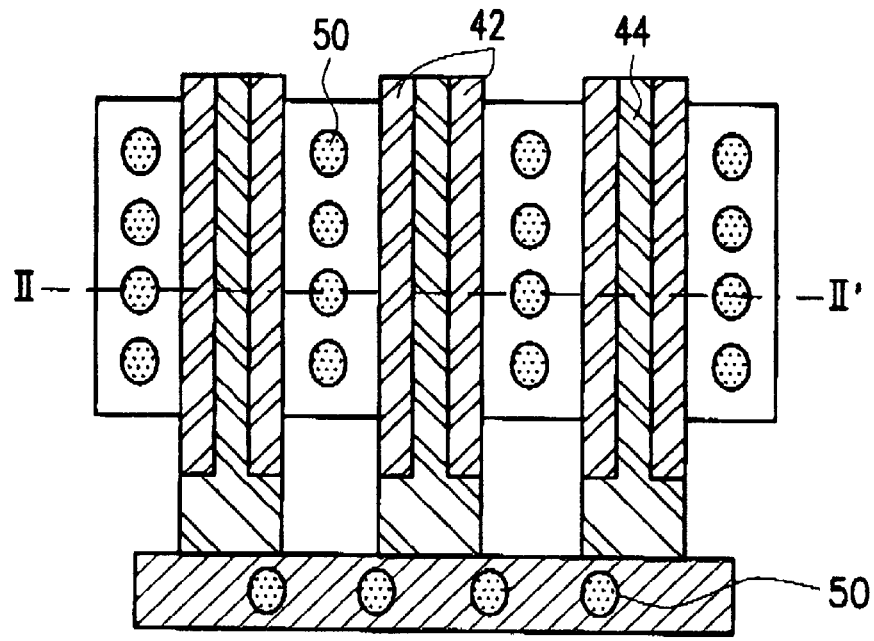
FIG. 5A is a top view of FIG. 4E before forming a metal layer.
Figure 5C:
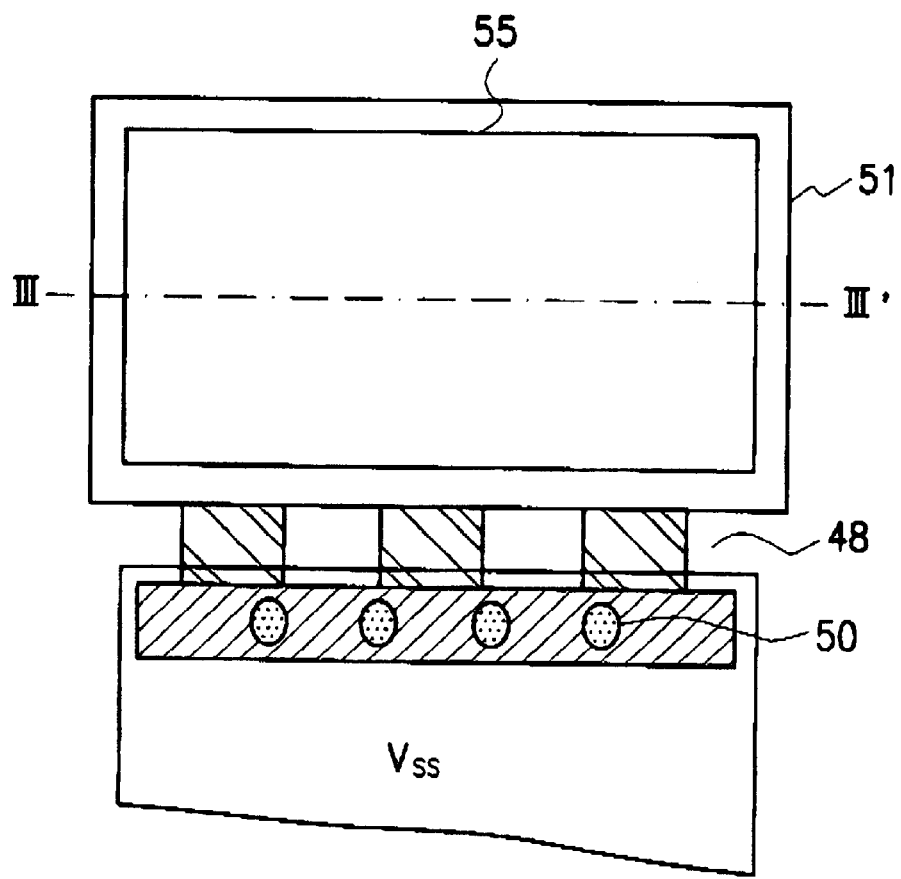
FIG. 5C is a top view of FIG. 4F.
Figure 5B:
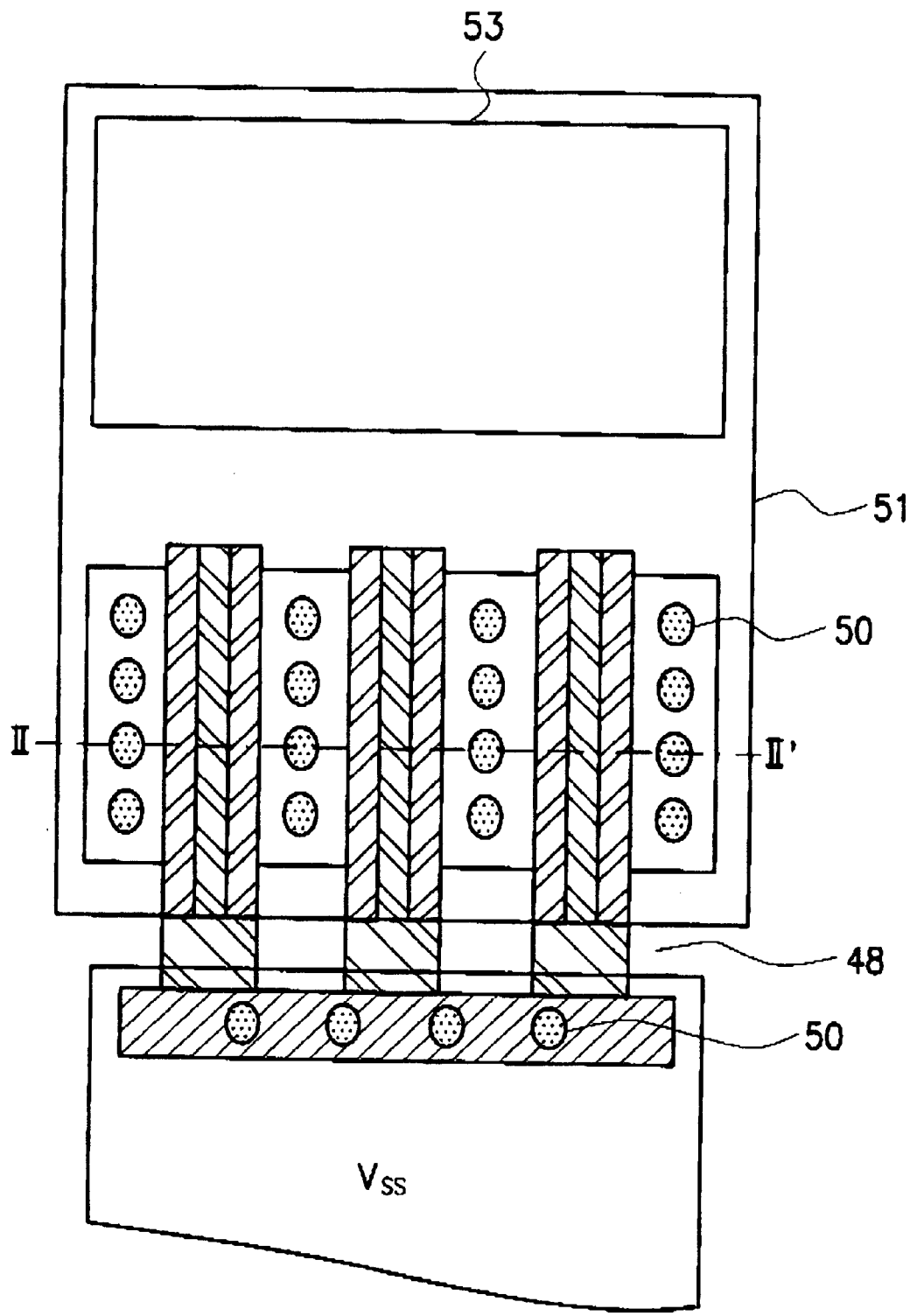
FIG. 5B is a top view of FIG. 4E.

For convenient description, referring to FIGS. 5A and 5B, whether the metal layer 51 is formed or not is main difference between FIG. 5A and FIG. 5B. In FIGS. 5A and 5B, reference number 50 designates vias; reference numbers 42 and 44 designate a first polysilicon layer and a second polysilicon layer which are connected to each other, and then coupled to ground $V_{ss}$ (that is, the source 45 and the gates 52 are connected to ground $V_{ss}$ together). Since the metal layer 51 is formed on vias 50 and the dielectric layer 48 to cover the N-type MOS electrostatic discharge protective circuit, an input line I/P can be formed on such large area of the metal layer 51, thereby enhancing the capability of heat dissipation, and then a metal boning pad 53 is formed. Therefore, the second ploysilicon layer 44 formed on the first polysilicon layer 42 can also increase the widthes of the internal connective conductors and the pitches between the internal connective conductors.

Figure 4F:
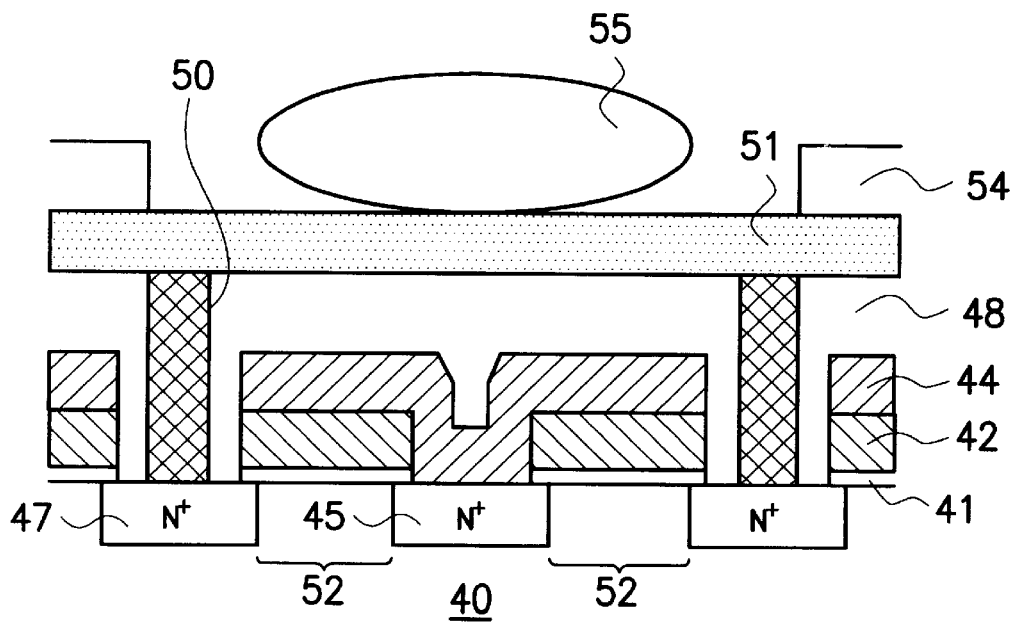

Finally, the structure of an electrostatic discharge protective circuit can further be formed on the bottom of a bonding pad. As shown in FIG. 4F, a passivation 54 is formed on the metal layer 51, and then a metal bonding pad 55 serving as an input bonding pad is formed.

As compared to the top view as shown in FIG. 5B, a bonding pad is further formed on the top of the structure of an the N-type MOS electrostatic discharge and overlaps with the MOS transistor in top view protective circuit. Referring to FIG. 5C, the metal bonding pad 55 is directly formed on the top of the structure of an electrostatic discharge protective circuit, wherein FIG. 5C is a top view of FIG. 4F. This design can further greatly reduce chip area without affecting the capability of electrostatic discharge. Moreover, it shows great contribution to electrostatic discharge protective circuits having a large number of pins (a larger number of bonding pads).

Accordingly, a first feature of an electrostatic discharge protective circuit for SRAM according to the invention is that a large metal layer is disposed on a drain region, thereby enhancing the capability of heat dissipation.

A second feature of an electrostatic discharge protective circuit for SRAM according to the invention is that source and gate of a MOS transistor together are connected to ground by buried contact window process, thereby not only shrinking the source area to a minimum, but also maintaining the width of the common conductor of the source and gate at a proper value.

A third feature of an electrostatic discharge protective circuit for SRAM according to the invention is that a bonding pad is formed on the top of an electrostatic discharge protective circuit, thereby greatly reducing chip area without affecting the capability of electrostatic discharge. In addition, it is more suitable for the structure of an electrostatic circuit having a large number of pins.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangement.

What is claimed is:

1. A structure of an electrostatic discharge protective circuit for SRAM, in which at least one MOS transistor formed on a semiconductor substrate is coupled between an input port and an internal circuit, and an input bonding pad is coupled to said input port and said internal circuit, comprising:

a drain of said MOS transistor;

a gate of said MOS transistor;

a source of said MOS transistor connected to said gate via a polysilicon layer which is coupled to a potential line, wherein said source is not deeper than said drain;

a dielectric layer formed on said drain, said gate and said source;

a metal layer formed on said dielectric layer, wherein the metal layer covers substantially whole upper surface of the dielectric layer and does not directly contacts the semiconductor substrate, and said input bonding pad is formed on and directly connected to said metal layer and located directly over the top of said MOS transistor; and a via connecting said drain to said metal layer.

2. A structure as claimed in claim 1, wherein said MOS transistor is an N-type MOS transistor.

3. A structure as claimed in claim 2, wherein said potential line is ground.

4. A structure as claimed in claim 1, wherein said MOS transistor is a P-type MOS transistor.

5. A structure as claimed in claim 4, wherein said potential line is a voltage source line.

6. A structure of an electrostatic discharge protective circuit for SRAM, in which at least one MOS transistor consisting of a drain, a gate and a source formed on a semiconductor substrate is coupled between an input port and an internal circuit wherein said source is not deeper than said drain, comprising:

a polysilicon layer formed on said gate, which connects said gate and said source, as well as a potential line;

a dielectric layer formed on said drain, said gate and said source;

a metal layer formed on said dielectric layer, said metal layer covering substantially whole upper surface of the dielectric layer, but not directly contacting the surface of the semiconductor substrate and covering the whole semiconductor substrate;

a via penetrating said dielectric layer and electrically connecting said drain to said metal layer; and an input bonding pad disposed above said MOS transistor, which connects said metal layer to said input port and said internal circuit, wherein said input bonding pad is formed directly over top of said MOS transistor and overlaps with said MOS transistor in top view, and said metal layer directly connects to said input bonding pad.

7. A structure as claimed in claim 6, wherein said MOS transistor is an N-type MOS transistor.

8. A structure as claimed in claim 7, wherein said potential line is ground.

9. A structure as claimed in claim 6, wherein said MOS transistor is a P-type MOS transistor.

10. A structure as claimed in claim 9, wherein said potential line is a voltage source line.

11. A structure as claimed in claim 1, wherein said via comprises a layer of titanium, a layer of titanium nitride, and a layer of tungsten.

12. A structure as claimed in claim 6, wherein said via comprises a layer of titanium, a layer of titanium nitride, and a layer of tungsten.

13. A structure of an electrostatic discharge protective circuit for SRAM, in which at least one MOS transistor formed on a semiconductor substrate is coupled between an input port and an internal circuit, and an input bonding pad is coupled to said input port and said internal circuit, comprising:

a drain of said MOS transistor;

a gate of said MOS transistor, wherein said gate comprises a first polysilicon layer;

a source of said MOS transistor connected to said gate via a second polysilicon layer which is coupled to a potential line, wherein said source is not deeper than said drain;

a dielectric layer formed on said drain, said gate and said source;

a metal layer made of a first metal formed on said dielectric layer and coupled to said input bonding pad, wherein the metal layer covers substantially the whole semiconductor substrate and said metal layer is separate from the gate;

an input bonding pad formed on said metal layer, which connects said metal layer to said input port and said internal circuit, wherein said input bonding pad is formed directly over the top of said MOS transistor and overlaps with said MOS transistor in top view, and said metal layer directly connects to said input bonding pad; and a via connecting said drain to said metal layer.

14. A structure as claimed in claim 13, wherein said second metal comprises titanium, titanium nitride, and tungsten.

* * * * *